United States Patent
Srinivasan

(10) Patent No.: US 7,152,217 B1
(45) Date of Patent: Dec. 19, 2006

(54) ALLEVIATING TIMING BASED CONGESTION WITHIN CIRCUIT DESIGNS

(75) Inventor: Sankaranarayanan Srinivasan, Boulder, CO (US)

(73) Assignee: Xilinx, Inc., San Jose, CA (US)

( * ) Notice: Subject to any disclaimer, the term of this patent is extended or adjusted under 35 U.S.C. 154(b) by 319 days.

(21) Appl. No.: 10/828,895

(22) Filed: Apr. 20, 2004

(51) Int. Cl.
*G06F 17/50* (2006.01)

(52) U.S. Cl. .............................. 716/13; 716/6; 716/10; 716/11; 716/12; 716/14

(58) Field of Classification Search .................... 716/2, 716/4–7, 9–13, 18, 6, 14; 257/784
See application file for complete search history.

(56) References Cited

U.S. PATENT DOCUMENTS

| | | | | |
|---|---|---|---|---|
| 6,110,222 | A * | 8/2000 | Minami et al. ................. | 716/9 |
| 6,286,128 | B1 * | 9/2001 | Pileggi et al. ................. | 716/18 |
| 6,415,427 | B1 * | 7/2002 | Nitta et al. .................... | 716/10 |
| 6,557,145 | B1 * | 4/2003 | Boyle et al. .................... | 716/2 |
| 6,567,967 | B1 * | 5/2003 | Greidinger et al. ............. | 716/10 |
| 6,601,222 | B1 * | 7/2003 | Mehrotra et al. .............. | 716/5 |
| 6,609,241 | B1 * | 8/2003 | Yonemori ..................... | 716/12 |
| 6,668,365 | B1 * | 12/2003 | Harn .......................... | 716/10 |
| 6,766,504 | B1 * | 7/2004 | Rahut et al. .................. | 716/13 |
| 6,810,515 | B1 * | 10/2004 | Lu et al. ....................... | 716/18 |
| 6,901,571 | B1 * | 5/2005 | Petranovic et al. ........... | 716/10 |
| 6,904,585 | B1 * | 6/2005 | Brittain et al. ................ | 716/13 |
| 6,952,816 | B1 * | 10/2005 | Gupta et al. .................. | 716/18 |
| 6,990,646 | B1 * | 1/2006 | Yoshikawa ..................... | 716/6 |
| 7,051,312 | B1 * | 5/2006 | Rahut et al. .................. | 716/13 |
| 2002/0087940 | A1 * | 7/2002 | Greidinger et al. ............ | 716/2 |
| 2003/0009727 | A1 * | 1/2003 | Takeyama et al. ............. | 716/1 |
| 2003/0023943 | A1 * | 1/2003 | Teig et al. ..................... | 716/7 |
| 2004/0040007 | A1 * | 2/2004 | Harn .......................... | 716/11 |
| 2004/0041281 | A1 * | 3/2004 | Sakai et al. ................... | 257/784 |
| 2004/0230933 | A1 * | 11/2004 | Weaver et al. ................ | 716/12 |
| 2004/0243964 | A1 * | 12/2004 | McElvain et al. ............. | 716/12 |
| 2005/0138590 | A1 * | 6/2005 | Amundson et al. ........... | 716/11 |
| 2005/0268258 | A1 * | 12/2005 | Decker ......................... | 716/4 |
| 2005/0289499 | A1 * | 12/2005 | Ogawa et al. ................ | 716/18 |

OTHER PUBLICATIONS

Hu et al., "A timing-constrained simultaneous global routing algorithm", Sep. 2002, Computer-Aided Design of Integrated Circuits and Systems, IEEE Transactions on, vol. 21, Issue 9, pp. 1025-1036.*
U.S. Appl. No. 10/638,242, filed Aug. 7, 2003, Srinivasan et al.

* cited by examiner

*Primary Examiner*—Paul Dinh
*Assistant Examiner*—Helen Rossoshek
(74) *Attorney, Agent, or Firm*—Pablo Meles; Kevin Cuenot

(57) ABSTRACT

A method of relieving timing-based congestion during physical implementation of a programmable logic device can include routing a placed circuit design for the programmable logic device in a delay mode and calculating an initial delay for connections of the circuit design based upon the routing step. A final delay for connections of the circuit design can be predicted with connection sharing removed. Connections of the circuit design that do not conform with timing constraints based upon at least one of the initial delays or the final delays can be identified. Accordingly, a detailed routing of the circuit design or further optimization of the circuit design can be selectively performed according to the determination regarding the timing constraints.

21 Claims, 2 Drawing Sheets

ALLEVIATING TIMING BASED CONGESTION WITHIN CIRCUIT DESIGNS

BACKGROUND

1. Field of the Invention

This invention relates to the field of integrated circuits and, more particularly, to accommodating timing-based congestion within such devices.

2. Description of the Related Art

Very Large Scale Integrated (VLSI) circuits such as application specific integrated circuits (ASIC's) and field programmable gate arrays (FPGA's), have become increasingly complex and heterogeneous. Modern integrated circuits can include a variety of different components or resources including, but not limited to, block random access memories (RAM's), multipliers, processors, logic blocks, and the like. These components must be interconnected using a variety of different routing resources. The routing resources, however, are finite. As such, competition among components for wiring resources can dictate many aspects of an integrated circuit design such as area usage and timing performance.

Competition for wiring resources can be referred to as congestion. Modeling resource-based congestion has become an important aspect of integrated circuit design. A resource-based congestion model attempts to depict congestion within the integrated circuit design without regard for timing characteristics. Several resource-based congestion models have been proposed in the context of integrated circuit design. These models have included empirical models such as Rent's Rule, stochastic models that utilize probabilistic approaches, as well as the detection of congestion using a global router.

With respect to integrated circuit design, however, timing constraints and timing characteristics must be taken into account. In illustration, for an integrated circuit to function properly, particular connections and paths must conform to predetermined timing constraints. Additionally, some resources such as wires have more favorable timing characteristics than others. Such is the case as wires available within an integrated circuit can be of varying length and can be made of different materials. Thus, a signal propagating through one wire can require more or less time depending upon the length of the wire and the type of material from which the wire was made. There tends to be increased competition among components for wires having more favorable signal propagation characteristics, particularly in light of timing constraints.

Whenever demand for timing efficient resources exceeds the supply, timing-based congestion results. What is needed is a technique for dealing with timing-based congestion in the context of integrated circuit design.

SUMMARY OF THE INVENTION

The present invention provides a method, system, and apparatus for detecting and alleviating timing-based congestion. Based upon an initial routing of an integrated circuit design, an initial delay associated with each connection of the circuit design can be determined. A final delay for the connections can be predicted based upon the congestion, or competition for wiring resources within the circuit design. Accordingly, the final delay prediction can be evaluated with respect to any timing constraints of the circuit design to determine whether to perform a detailed routing of the circuit design or optimize the circuit design further.

One embodiment of the present invention can include a method of relieving timing-based congestion during physical implementation of an integrated circuit. The method can include routing a placed circuit design of the integrated circuit in a delay mode, wherein the routed circuit design includes at least one instance of connection sharing. An initial delay for connections of the circuit design can be calculated based upon the routing step. A final delay for connections of the circuit design can be predicted with connection sharing removed. The final delays can be predicted according to the initial delays and a measure of connection sharing within the circuit design. Connections of the circuit design that do not conform with timing constraints based upon at least one of the initial delays or the final delays can be identified. A detailed routing of the circuit design or further optimization of the identified connections of the circuit design can be performed based upon the identifying step.

Other embodiments of the present invention can include a machine readable storage for causing a machine to perform the steps disclosed herein as well as a system for performing the various steps disclosed herein.

BRIEF DESCRIPTION OF THE DRAWINGS

There are shown in the drawings, embodiments which are presently preferred, it being understood, however, that the invention is not limited to the precise arrangements and instrumentalities shown.

DETAILED DESCRIPTION OF THE INVENTION

Figure 1:
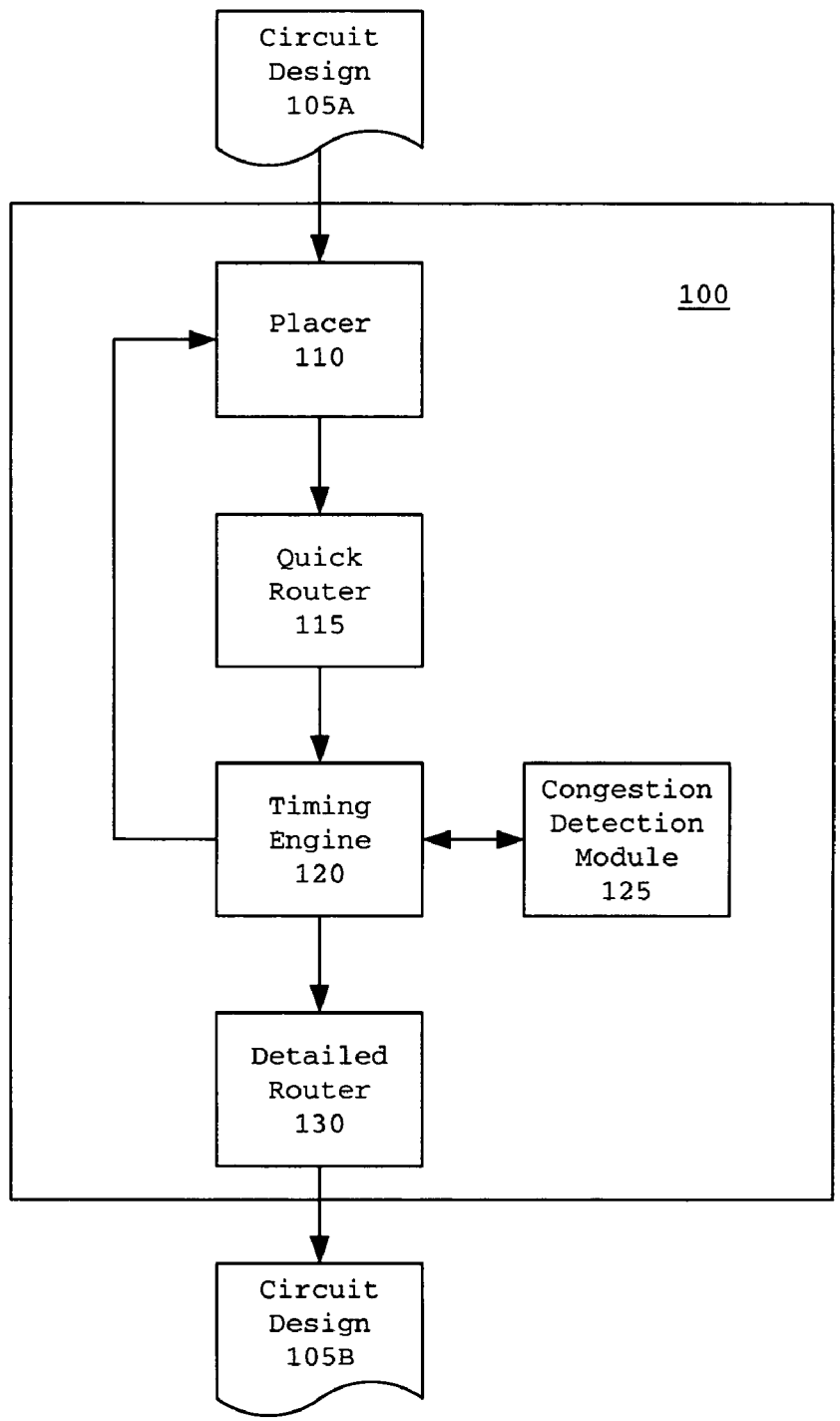
FIG. 1 is a schematic diagram illustrating one embodiment of a system for relieving timing-based congestion of a circuit design.

FIG. 1 is a schematic diagram illustrating one embodiment of a system 100 for relieving timing-based congestion of a circuit design for an integrated circuit. In accordance with the inventive arrangements disclosed herein, system 100 can be used to place and route integrated circuits such as FPGA's and ASIC's. As shown, the system 100 can include a placer 110, a quick router 115, a timing engine 120, a congestion detection module 125, and a detailed router 130.

The placer 110 can load a circuit design 105A, such as a netlist or other circuit representation specifying components, functionality, and connectivity. The placer 110 performs an initial assignment of components to physical locations on the circuit. The initially placed circuit design can be provided to the quick router 115. The quick router 115 receives the circuit design and identifies one or more vectors of signals to be routed. Accordingly, the quick router 115 performs an initial routing of signals in the circuit design. Further details on the quick router are disclosed in U.S. patent application Ser. No. 10/637,242, entitled "Using Routing Feedback for Placement Improvements for Logic Design," by Sankaranarayanan Srinivasan, et. al., filed Aug. 7, 2003, which is herein incorporated by reference.

Signals between a source and load, referred to as a connection, typically can be routed in one of two modes, a resource mode or a delay mode. In resource mode, connections are routed between source and load using a minimum number of wires or resources. Resource mode does not minimize the propagation delay for a connection.

By comparison, in delay mode, connections are routed such that the signal propagation delay is minimized. Unless the placement of a circuit design is altered, a connection routed in delay mode cannot be optimized any further in terms of signal propagation delay. The delay mode, however, permits overlap conditions to occur. An overlap condition refers to the case where more than one signal shares a single wire, an infeasible condition.

The quick router 115 performs the initial routing using the delay mode which allows overlap conditions to occur. While overlap conditions lead to an infeasible routing, valuable timing information can be determined from such a state. In one embodiment of the present invention the quick router routes the timing critical connections in the delay mode and the non-critical or non-timing sensitive connections in a non-delay mode, e.g., resource mode.

The circuit design is then passed to the timing engine 120. The timing engine 120 performs a timing analysis upon the initial routing of the circuit design. The timing analysis yields timing information which can include, but is not limited to, slack values for connections as well as connection and/or path delays. Slack values indicate the degree by which a connection meets, exceeds, or fails a target delay for a connection as specified by the timing constraints. Thus, for example, a zero value indicates the timing constraint for a connection is met exactly, a negative slack indicates a failing connection, and a positive slack indicates a passing connection. The more negative the slack, the greater the degree by which the connection fails the target delay. The higher the value of a positive slack, the greater the degree by which the connection exceeds the target delay.

The timing engine 120 further can compare the timing information for each connection with the target delay associated with that connection as specified by the predetermined timing constraints. Accordingly, the timing engine 120 can determine whether the circuit design meets the timing constraints.

The congestion detection module 125 can calculate predictions of connection delays assuming overlap conditions have been removed. The connections delays predicted by the congestion detection module 125 can be provided back to the timing engine 120, which then can perform a slack/criticality calculation based upon the predicted connection delay values.

Notably, with respect to evaluating delays for connections, connections can be categorized into one of three different classes. The first class of connection is where the initial delay of the connection fails its timing requirement. In that case, since the connection has already been routed in delay mode, the predicted delay will also fail the timing requirement because the predicted delay cannot be less than the already optimized delay of the connection. Connections of this variety will fail timing requirements even if no congestion/overlap exists with respect to resources used by the connections. These connections can only be alleviated through placement changes or physical synthesis.

The second class of connection includes connections where both the initial timing delay and the predicted final delay of the connection pass the timing constraint. In other words, a prediction has been made that such connections will meet associated timing constraints after a detailed routing is performed. Notably, if all connections of the design are categorized as belonging to the second class of connections, the circuit design can be successfully routed in a manner than meets all timing constraints without any need for congestion alleviation.

The third class includes connections where the initial delay passes the timing constraint, but the predicted final delay of the connection fails the timing constraint. This third class of connection is representative of the effects of timing-based congestion. The connections corresponding to this scenario must be addressed.

If the timing analysis reveals that one or more connections are not meeting the timing constraints the circuit design can be further optimized by the placer 110 and the quick router 115. More particularly, the placer 110 can perform incremental placement optimizations on the circuit design with respect to components associated with failing connections. An incremental or minor change to a circuit design can be one in which an insubstantial number of components is changed or moved. For example, in one embodiment, an incremental change can be one that alters less than approximately 10% of the components of a circuit design. Still, it should be appreciated that incremental placement changes can include re-packing lookup tables (LUT's) and flip-flops as well as moving components to new locations.

Thus, the placer 110 can identify any connections which do not meet the timing constraints as determined by the timing engine 130. Components associated with failing connections also can be identified. The placer 110 can relocate one or more components in an effort to reduce the delay associated with failing connections with the goal of meeting or exceeding the timing constraints.

With respect to components sharing a failing connection belonging to the first class, timing constraints can be met by moving the components closer to one another. With respect to components sharing a failing connection belonging to the third class, such components can be relocated to another area of the circuit design where less competition for routing resources exists. It should be appreciated, however, that indiscriminately moving components closer to one another can lead to increased connection failures for the third class of connections, as moving components closer together can produce increased competition for limited routing resources.

The circuit design, having one or more components assigned to new positions, can be provided to the quick router 115. The quick router 115 can then reroute only those connections that have been affected by the relocation of components by the placer 110.

While the system 100 can operate on the placement of the circuit design in an iterative fashion, once a determination is made by the timing engine 120 that the connections meet or exceed the timing constraints, the placed circuit design can be provided to the detailed router 130. The detailed router 130 then can perform a detailed or final routing to produce circuit design 105B. More particularly, the detailed router 130 can operate on the circuit design to route signals in accordance with predetermined or programmed design constraints and timing information determined during the placement phase. In one embodiment of the present invention, the detailed router 130, rather than begin perform an entirely new routing, can receive the overlapped solution as input and operate on the overlapped solution to produce a non-overlapping, or legal, solution.

In any event, the detailed router 130 can route signals, verify that the routing complies with established design constraints, and ensure that the resulting routing is feasible. In other words, the detailed router 130 does not utilize an overlap mode.

The placer 110, the quick router 115, the timing engine 120, and the detailed router 130 can be implemented as application programs executing within a suitable computer and/or information processing system. It should be appreciated that while each is depicted in FIG. 1 as a separate entity, one or more of the application programs can be combined into a larger, more complex application. For example, the quick router 115 and the placer 110 can be combined if so desired. In any case, those skilled in the art will recognize that the examples presented herein are not intended as a limitation of the present invention.

Figure 2:
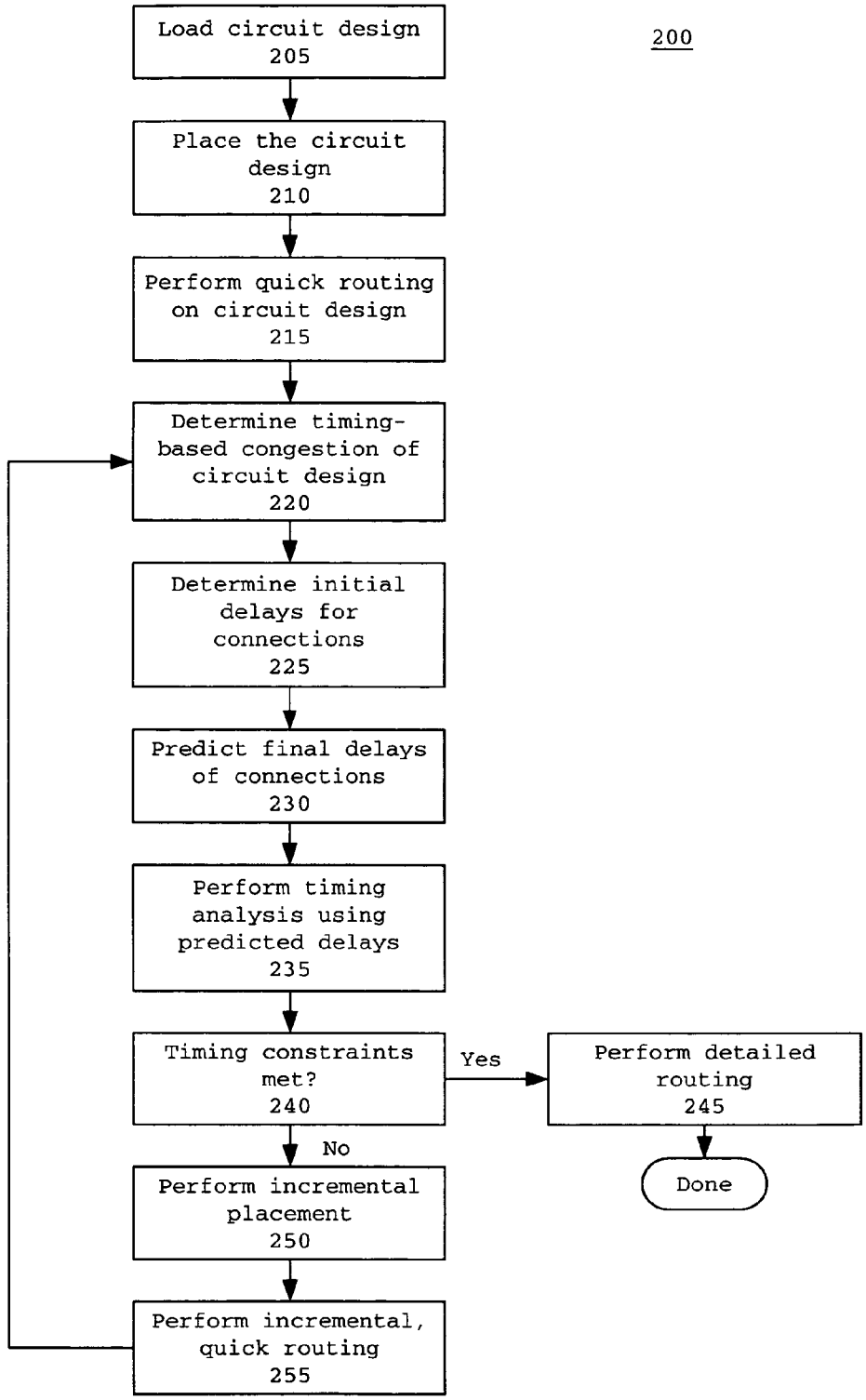
FIG. 2 is a flow chart illustrating a method of relieving timing-based congestion of a circuit design in accordance with another embodiment of the present invention.

FIG. 2 is a flow chart illustrating a method 200 of relieving timing-based congestion of a circuit design in accordance with another embodiment of the present invention. The method 200 can begin in step 205 where a circuit design for an integrated circuit is loaded into a circuit design system as described herein. In step 210, the circuit design can be placed. In step 215, a quick routing of the circuit design is performed using a delay mode.

At this point, one or more competing connections may be using a single wire of the circuit design. If so, the routing is an infeasible one. To produce a feasible routing, each wire within the circuit design must have only a single connection using that wire. Such a condition can be referred to as overlap free. Still, the overlap condition provides an indication as to the timing-based congestion of the circuit design.

In step 220, the timing-based congestion of the circuit design can be determined based upon the quick routing. More particularly, the number of contenders, i.e., connections competing, or assigned, to a wire can be determined for one or more, or all, wires of the circuit design. Thus, for each given wire, the number of contending connections for that wire can be obtained. In step 225, the initial delay for each connection of the circuit design can be determined. A connection is an abstract concept connecting two modules in a circuit design and includes one or more wires, that are the actual implementation of the connection on the integrated circuit such as the programmable interconnection resources of an FPGA. Hence each connection is routed using one or more wires and a wire on the integrated circuit can be shared by multiple connections in the overlap mode.

In step 230, a prediction of the final delays for connections can be determined. The phrase "final delay" for a connection refers to the delay of the connection after overlap conditions have been removed. This final delay value for one or more, or all, of the connections of the circuit design can be predicted without having to actually reroute the circuit design without overlaps. Accordingly, a designer can, based upon the final delay predictions, determine whether a circuit design is likely to meet or fail timing constraints.

The final delays for connections can be determined by first calculating the number of contenders for a connection. One way to determine the number of contenders for a connection (i.e., NumContendersForConnection) is to sum the number of connections sharing each wire (i.e., NumContenderForWire) of a given connection. In another embodiment, a weighted sum can be determined where the weighting factor is derived by analyzing the delay for a particular wire or by analyzing the relative timing criticalities of the connections using the wire. In any case, the number of contenders for a connection can be determined using the following formula:

NumContendersForConnection=$\Sigma\alpha_i$(NumContenderForWire), where $\alpha_i$ can be the weighting factor for the ith wire. Notably, the weighting factor $\alpha_i$ can be set equal to 1, for all i, in the case where no weighting factor is desired.

In yet another embodiment, the weighting factor can be determined by analyzing the importance of a wire during the overlap removal phase. A history parameter can be defined to record the congestion on a wire, i.e. the number of connections using the wire, during overlap removal iterations. In the overlap removal phase, the connections on a wire can be removed based upon the criticality of the connection and re-routed by increasing the cost of the wires in the device.

Accordingly, the final delay of a connection can be calculated using the following formula:

FinalDelay=InitialDelay(1+$\beta$*NumContendersForConnection), where $\beta$ is a factor which, along with the number of contenders for a connection, determines the degree to which the connection will degrade in terms of delay due to congestion. In one embodiment, the factor $\beta$ can be determined by performing a statistical analysis on the initial and final delay values for a set of timing constrained connections in different circuit designs.

In another embodiment, this factor can be dynamically generated during design implementation by executing one or more iterations of an overlap removal technique or routine in the router where some nets are ripped up and rerouted. As such, those nets undergo a degradation in delay. Still, in yet another embodiment, the factor $\beta$ can be implemented as a time changing function.

It should be appreciated, however, that other models may be used to predict the final delay of a connection. For example, a quadratic model can be used. As such, the present invention is not limited to the use of one particular type of model, as the linear model presented herein has been used for purposes of illustration only.

In step 235, a timing analysis can be performed using the predicted delays for the circuit design connections. In step 240, a determination can be made as to whether predetermined timing constraints regarding the circuit design, and specifically for each connection, have been met. If so, the method can proceed to step 245 to perform a detailed routing of the circuit design. Once complete, the method can end.

If, however, the timing constraints for one or more connections have not been met, the connections of the circuit design that do not conform with timing constraints based upon at least one of the initial and final delays can be identified. Accordingly, the method can proceed to step 250 where incremental placement of the circuit design can be performed. In one embodiment, only those components associated with connections that do not conform with timing constraints need be operated upon. In step 255, incremental quick routing can be performed. The method can loop back to step 220 to determine the timing-based congestion of the circuit design and repeat as necessary.

It should be appreciated that while the method can end when all connections comply with the timing constraints, other termination criteria can be used as well. For example, in one embodiment, the method 200 can terminate if a solution is not found after a predetermined number of iterations. In another embodiment, the method 200 can terminate if the timing characteristics do not improve by a predetermined percentage from one iteration to the next. For example, improvement can be measured by the number of failing connections from one iteration to the next.

The present invention provides a method, system, and apparatus for detecting timing-based congestion. In accordance with the inventive arrangements disclosed herein, after a quick routing of the circuit design is performed, an initial delay for one or more connections of the circuit design can be determined. A final delay for the connections can be predicted based upon the initial delay and an analysis of the timing-based congestion of the circuit design. The final delays are used to perform a timing analysis of the circuit design. Based upon whether the circuit design meets imposed timing constraints, the circuit design can be optimized or provided to a detailed router.

The present invention can be realized in hardware, software, or a combination of hardware and software. The present invention can be realized in a centralized fashion in one computer system, or in a distributed fashion where different elements are spread across several interconnected computer systems. Any kind of computer system or other apparatus adapted for carrying out the methods described herein is suited. A typical combination of hardware and software can be a general purpose computer system with a computer program that, when being loaded and executed, controls the computer system such that it carries out the methods described herein.

The present invention also can be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

This invention can be embodied in other forms without departing from the spirit or essential attributes thereof. Accordingly, reference should be made to the following claims, rather than to the foregoing specification, as indicating the scope of the invention.

What is claimed is:

1. A method of detecting and relieving timing-based congestion during physical implementation of an integrated circuit, said method comprising:
   routing connections of a circuit design for the integrated circuit in a delay mode, wherein the routed circuit design includes at least one instance of connection sharing;
   calculating an initial delay for the connections of the circuit design;
   predicting a final delay for the connections of the circuit design with connection sharing removed, wherein the final delays are predicted according to the initial delays and a measure of connection sharing within the circuit design;
   identifying connections of the circuit design that do not conform with timing constraints based upon at least one of the initial delays or the final delays; and
   selectively performing a detailed routing of the circuit design or further optimizing the identified connections of the circuit design according to said identifying step.

2. The method of claim 1, for each connection, said predicting step comprising:
   determining a number of connections sharing each wire by said routing step;
   summing the number of connections for each wire; and
   adding the initial delay to a product of the summed number of connections and the initial delay.

3. The method of claim 2, said summing step comprising multiplying the summed number of connections by a weighting factor.

4. The method of claim 2, said step of adding the initial delay comprising first multiplying the product by a weighting factor.

5. The method of claim 1, said predicting step further comprising using a quadratic model to predict the final delays.

6. The method of claim 1, said step of further optimizing the circuit design comprising at least one of incrementally placing the circuit design or performing physical synthesis on the circuit design.

7. The method of claim 6, said step of further optimizing the circuit design comprising rerouting connections changed by said incrementally placing step.

8. A computer automated system for detecting and relieving timing-based congestion during physical implementation of an integrated circuit, said system comprising:
   means for routing a placed circuit design for the integrated circuit in a delay mode, wherein the routed circuit design includes at least one instance of connection sharing;
   means for calculating an initial delay for connections of the circuit design based upon said routing step;
   means for predicting a final delay for the connections of the circuit design with connection sharing removed, wherein the final delays are predicted according to the initial delays and connection sharing within the circuit design;
   means for identifying connections of the circuit design that do not conform with timing constraints based upon at least one of the initial delays or the final delays; and
   means for selectively performing a detailed routing of the circuit design or further optimizing the identified connections of the circuit design according to a result obtained by said means for identifying.

9. The system of claim 8, said means for predicting comprising:
   means for determining a number of connections assigned to each wire by said means for routing;
   means for summing the number of connections for each wire; and
   means for adding the initial delay to a product of the summed number of connections and the initial delay.

10. The system of claim 9, said means for summing comprising means for multiplying the summed number of connections by a weighting factor.

11. The system of claim 9, said means for adding the initial delay comprising means for first multiplying the product by a weighting factor.

12. The system of claim 8, said means for predicting further comprising using a quadratic model to predict the final delays.

13. The system of claim 8, said means for selecting comprising at least one of means for incrementally placing the circuit design or performing physical synthesis on the circuit design.

14. The system of claim 13, said means for selecting comprising means for rerouting connections changed by said incrementally placing step.

15. A machine readable storage, having stored thereon a computer program having a plurality of code sections executable by a machine for causing the machine to perform the steps of:

routing a placed circuit design for an integrated circuit in a delay mode, wherein the routed circuit design includes at least one instance of connection sharing;

calculating an initial delay for connections of the circuit design based upon said routing step;

predicting a final delay for the connections of the circuit design with connection sharing removed, wherein the final delays are predicted according to the initial delays and connection sharing within the circuit design;

identifying connections of the circuit design that do not conform with timing constraints based upon at least one of the initial delays or the final delays; and selectively performing a detailed routing of the circuit design or further optimizing the identified connections of the circuit design according to said identifying step.

16. The machine readable storage of claim 15, for each connection, said predicting step comprising:

determining a number of connections assigned to each wire by said routing step;

summing the number of connections for each wire; and adding the initial delay to a product of the summed number of connections and the initial delay.

17. The machine readable storage of claim 16, said summing step comprising multiplying the summed number of connections by a weighting factor.

18. The machine readable storage of claim 16, said step of adding the initial delay comprising first multiplying the product by a weighting factor.

19. The method of claim 15, said predicting step further comprising using a quadratic model to predict the final delays.

20. The machine readable storage of claim 15, said step of further optimizing the circuit design comprising at least one of incrementally placing the circuit design or performing physical synthesis on the circuit design.

21. The machine readable storage of claim 20, said step of further optimizing the circuit design comprising rerouting connections changed by said incrementally placing step.

* * * * *